United States Patent
Zhong et al.

(10) Patent No.: US 11,967,848 B2
(45) Date of Patent: Apr. 23, 2024

(54) BATTERY SYSTEM AND METHOD FOR DETECTING STATE OF HEALTH OF BATTERY

(71) Applicant: Huawei Digital Power Technologies Co., Ltd., Shenzhen (CN)

(72) Inventors: Zheng Zhong, Shenzhen (CN); Dong Feng, Beijing (CN); Jianye Zhang, Dongguan (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 703 days.

(21) Appl. No.: 17/119,351

(22) Filed: Dec. 11, 2020

(65) Prior Publication Data

US 2021/0098995 A1 Apr. 1, 2021

Related U.S. Application Data

(63) Continuation of application No. PCT/CN2019/083432, filed on Apr. 19, 2019.

(30) Foreign Application Priority Data

Jun. 12, 2018 (CN) .......................... 201810602971.1

(51) Int. Cl.
*H02J 7/00* (2006.01)
*G01R 31/392* (2019.01)
(Continued)

(52) U.S. Cl.
CPC ............ *H02J 7/005* (2020.01); *G01R 31/392* (2019.01); *H01M 10/425* (2013.01);
(Continued)

(58) Field of Classification Search
CPC .. H02J 7/005; H02J 7/0013; H02J 9/06; H02J 9/061; H01M 10/425; H01M 10/441;
(Continued)

(56) References Cited

U.S. PATENT DOCUMENTS

2016/0003917 A1* 1/2016 You ...................... G01R 31/367
 702/63
2017/0212174 A1* 7/2017 Uchida ............. G01R 31/3835

FOREIGN PATENT DOCUMENTS

CN 102376988 A 3/2012
CN 103197257 A 7/2013
(Continued)

*Primary Examiner* — Zixuan Zhou
(74) *Attorney, Agent, or Firm* — WOMBLE BOND DICKINSON (US) LLP

(57) ABSTRACT

A battery system is provided, including a processing module and a plurality of battery modules. Each of the plurality of battery modules includes a battery management system and an electrochemical cell pack controlled by the battery management system. The processing module is configured to control the electrochemical cell pack to alternately perform a discharging or charging operation. A sum of power of battery modules other than a first battery module in the plurality of battery modules is greater than power required by a target power-supplied object, and the first battery module is any one of the plurality of battery modules. A battery management system is configured to record a target time. The processing module or the battery management system is configured to determine a state of health of the electrochemical cell pack in the first battery module based on the target time.

20 Claims, 3 Drawing Sheets

(51) Int. Cl.
  *H01M 10/42*  (2006.01)
  *H01M 10/44*  (2006.01)
  *H01M 10/48*  (2006.01)
  *H02J 9/06*  (2006.01)

(52) U.S. Cl.
  CPC ....... *H01M 10/441* (2013.01); *H01M 10/482* (2013.01); *H02J 7/0013* (2013.01); *H02J 9/06* (2013.01); *H02J 9/061* (2013.01); *H01M 2010/4271* (2013.01); *H01M 2220/10* (2013.01)

(58) Field of Classification Search
  CPC ....... H01M 10/482; H01M 2010/4271; H01M 2220/10; G01R 31/392
  USPC ......................................................... 320/134
  See application file for complete search history.

(56) References Cited

FOREIGN PATENT DOCUMENTS

| | | | |
|---|---|---|---|
| CN | 103944225 | A | 7/2014 |
| CN | 106183857 | A | 12/2016 |
| CN | 106953401 | A | 7/2017 |
| CN | 106992325 | A | 7/2017 |
| CN | 108808776 | A | 11/2018 |

\* cited by examiner

BATTERY SYSTEM AND METHOD FOR DETECTING STATE OF HEALTH OF BATTERY

CROSS-REFERENCE TO RELATED APPLICATIONS

This application is a continuation of International Application No. PCT/CN2019/083432, filed on Apr. 19, 2019, which claims priority to Chinese Patent Application No. 201810602971.1, filed on Jun. 12, 2018. The disclosures of the aforementioned applications are hereby incorporated by reference in their entireties.

TECHNICAL FIELD

This application relates to the field of computer technologies, and in particular, to a battery system and a method for detecting a state of health of a battery.

BACKGROUND

A lithium-ion battery features an excellent energy storage capability, and therefore has been currently widely used in many fields such as a mobile terminal, an equipment room device, and a medical device. A state of health (SOH) of the lithium-ion battery is an important parameter reflecting performance of the lithium-ion battery. A state of health of a battery is defined as a percentage of a current battery capacity to a factory capacity. If the state of health of the battery is less than a preset threshold, it indicates that the battery cannot work normally and needs to be replaced. Currently, a plurality of lithium-ion batteries connected in parallel are usually used as a backup power supply of an equipment room. In this case, a method for detecting a state of health of the lithium-ion batteries is as follows: In a process in which the plurality of lithium-ion batteries connected in parallel provide electric energy for a target power-supplied object, the state of health of the plurality of lithium-ion batteries connected in parallel is calculated based on a power supply current and a power supply time. If the calculated state of health is less than the preset threshold, it indicates that the plurality of lithium-ion batteries cannot normally complete power supply work, and the plurality of lithium-ion batteries need to be replaced. In this manner, some lithium-ion batteries, in the plurality of lithium-ion batteries, that can work normally may also be replaced.

SUMMARY

Embodiments of this application provide a battery system and a method for detecting a state of health of a battery, so that a state of health of each of a plurality of battery modules can be detected, thereby improving accuracy of detecting a state of health of a battery.

According to a first aspect, an embodiment of this application provides a battery system. The battery system includes a processing module and a plurality of battery modules. Each of the plurality of battery modules includes a battery management system and an electrochemical cell pack controlled by the battery management system. The processing module is configured to control electrochemical cell packs in the plurality of battery modules to alternately perform a discharging or charging operation. A sum of power of electrochemical cell packs in battery modules other than a first battery module in the plurality of battery modules is greater than power required by a target power-supplied object. The first battery module is any one of the plurality of battery modules. A battery management system in the first battery module is configured to record a target time. The target time is discharge duration of an electrochemical cell pack in the first battery module, or charging duration of an electrochemical cell pack in the first battery module, or discharge duration and charging duration of an electrochemical cell pack in the first battery module. The battery management system in the first battery module or the processing module is configured to determine a state of health of the electrochemical cell pack in the first battery module based on the target time.

In an embodiment, the processing module controls the plurality of battery modules to alternately perform the discharging or charging operation, and then determines a state of health of each battery module based on the target time. In this way, states of health of the plurality of battery modules can be sequentially detected, thereby improving accuracy of detecting a state of health of a battery. In addition, a sum of power of electrochemical cell packs in battery modules other than any one of the plurality of battery modules is greater than the power required by the target power-supplied object. Therefore, it can be ensured that in a process of detecting a state of health of the any one of the plurality of battery modules, the battery modules other than the any one of the battery modules can normally provide electric energy for the target power-supplied object, thereby avoiding a problem that sufficient electric energy cannot be provided for the target power-supplied object in a process of detecting a state of health of a battery.

In an embodiment, the battery system is a backup power supply of a first power supply; and in the plurality of battery modules, battery modules other than a battery module that is performing the discharging or charging operation are configured to supply power to the target power-supplied object when the first power supply cannot supply power to the target power-supplied object. In this manner, in a process in which a battery module performs the discharging or charging operation, if the plurality of battery modules need to supply power to the target power-supplied object, the plurality of battery modules can provide sufficient power for the target power-supplied object because a sum of power of battery modules other than the battery module in the plurality of battery modules is not less than the power required by the target power-supplied object, thereby avoiding a problem that sufficient power cannot be provided for the target power-supplied object in a battery detection process.

In an embodiment, when controlling electrochemical cell packs in the plurality of battery modules to alternately perform a discharging or charging operation, the processing module is configured to alternately send first instruction information to battery management systems in the plurality of battery modules, where the first instruction information is used to instruct to discharge or charge the battery module; and the battery management system in each battery module is configured to control, based on the received first instruction information, the electrochemical cell pack in each battery module to perform the discharging or charging operation.

In an embodiment, the processing module may alternately send the first instruction information to the battery management systems in the plurality of battery modules, to instruct to discharge or charge the battery modules, and switching of a to-be-detected battery module does not need to be manually controlled. Therefore, efficiency of detecting the states of health of the plurality of battery modules can be improved. In addition, the electrochemical cell packs in the battery modules alternately perform an operation of discharging and then charging, so that a battery module whose state of health is detected can serve as a backup battery with sufficient power. In a process of detecting a state of health of another battery module, the battery module whose state of health is detected and a battery module whose state of health is not detected can be used together as a backup power supply, to provide sufficient power for the target power-supplied object.

In an embodiment, in the process of performing the charging and discharging operations, a discharge current is a preset discharge current, and a charging current is a preset charging current; and the determining a state of health of the electrochemical cell pack in the first battery module based on the target time includes: determining a first state of health of the electrochemical cell pack in the first battery module based on duration in which discharging is performed based on the preset discharge current; determining a second state of health of the electrochemical cell pack in the first battery module based on duration in which charging is performed based on the preset charging current; and determining the state of health of the electrochemical cell pack in the first battery module based on the first state of health and the second state of health.

In an embodiment, an average value of the first state of health and the second state of health is used as the state of health of the electrochemical cell pack in the first battery module. In this way, battery capacities during charging and discharging of the electrochemical cell pack can be comprehensively considered, thereby improving accuracy of detecting a state of health of a battery.

In an embodiment, in the process of performing the charging and discharging operations, a discharge current is a preset discharge current, and a charging current is a preset charging current; and the determining a state of health of the electrochemical cell pack in the first battery module based on the target time includes: determining a third state of health of the electrochemical cell pack in the first battery module based on duration in which discharging is performed based on the preset discharge current, a first state of charge, and a second state of charge, where the first state of charge is a state of charge obtained before the electrochemical cell pack is discharged, and the second state of charge is a state of charge obtained after the electrochemical cell pack is discharged to a cut-off voltage and before the electrochemical cell pack is charged; determining a fourth state of health of the electrochemical cell pack in the first battery module based on duration in which charging is performed based on the preset charging current, the second state of charge, and a third state of charge, where the third state of charge is a state of charge obtained after the electrochemical cell pack is fully charged; and determining the state of health of the electrochemical cell pack in the first battery module based on the third state of health and the fourth state of health.

In an embodiment, an average value of the third state of health and the fourth state of health is used as the state of health of the electrochemical cell pack in the first battery module. In this way, battery capacities and states of charge during charging and discharging of the electrochemical cell pack can be comprehensively considered, thereby further improving accuracy of detecting a state of health of a battery.

In an embodiment, determining a state of health of the electrochemical cell pack in the first battery module based on the target time, the processing module receives the target time sent by the battery management system in the first battery module; and determines the state of health of the electrochemical cell pack in the first battery module based on the target time.

According to a second aspect, an embodiment of this application provides a battery module. The battery module is one of a plurality of battery modules included in a battery system, and the battery module includes a battery management system and an electrochemical cell pack controlled by the battery management system. The battery management system is configured to control, based on first instruction information sent by a processing module in the battery system, the electrochemical cell pack to perform a discharging or charging operation. The first instruction information is used to instruct to discharge or charge the battery module. The battery management system is further configured to record a target time. The target time is discharge duration of the electrochemical cell pack in the battery module, or charging duration of the electrochemical cell pack in the battery module, or discharge duration and charging duration of the electrochemical cell pack in the battery module. The battery management system is further configured to: determine a state of health of the electrochemical cell pack based on the target time; or send the target time to the processing module in the battery system, so that the processing module determines a state of health of the electrochemical cell pack.

In an embodiment, the electrochemical cell pack can be controlled, based on the first instruction information sent by the processing module in the battery system, to perform the discharging or charging operation, the target time can be recorded, and the state of health of the electrochemical cell pack can be determined based on the target time; or the target time is sent to the processing module in the battery system, so that the processing module can calculate the state of health of the electrochemical cell pack based on the target time. During detection of a battery system including a plurality of such battery modules, states of health of the plurality of battery modules can be sequentially detected, thereby improving accuracy of detecting a state of health of a battery.

In an embodiment, a sum of power of battery modules other than the one battery module in the plurality of battery modules is greater than power required by a target power-supplied object; and the battery modules other than the one battery module are configured to supply power to the target power-supplied object when a first power supply cannot supply power to the target power-supplied object.

In this manner, in a process of detecting a state of health of the one battery module, if the plurality of battery modules need to supply power to the target power-supplied object, the plurality of battery modules can provide sufficient power for the target power-supplied object because the sum of power of the battery modules other than the one battery module in the plurality of battery modules is not less than the power required by the target power-supplied object, thereby avoiding a problem that sufficient power cannot be provided for the target power-supplied object in a battery detection process.

In an embodiment, in the process of performing the charging and discharging operations, a discharge current is a preset discharge current, and a charging current is a preset charging current; and that the battery management system is further configured to determine a state of health of the electrochemical cell pack based on the target time is that the battery management system determines a first state of health of the electrochemical cell pack based on duration in which discharging is performed based on the preset discharge current; determines a second state of health of the electrochemical cell pack based on duration in which charging is performed based on the preset charging current; and determines the state of health of the electrochemical cell pack based on the first state of health and the second state of health.

In an embodiment, an average value of the first state of health and the second state of health is used as the state of health of the electrochemical cell pack in the battery module. In this way, battery capacities during charging and discharging of the electrochemical cell pack can be comprehensively considered, thereby improving accuracy of detecting a state of health of a battery.

In an embodiment, in the process of performing the charging and discharging operations, a discharge current is a preset discharge current, and a charging current is a preset charging current; and that the battery management system is further configured to determine a state of health of the electrochemical cell pack based on the target time is that the battery management system determines a third state of health of the electrochemical cell pack based on duration in which discharging is performed based on the preset discharge current, a first state of charge, and a second state of charge, where the first state of charge is a state of charge obtained before the electrochemical cell pack is discharged, and the second state of charge is a state of charge obtained after the electrochemical cell pack is discharged to a cut-off voltage and before the electrochemical cell pack is charged; determines a fourth state of health of the electrochemical cell pack based on duration in which charging is performed based on the preset charging current, the second state of charge, and a third state of charge, where the third state of charge is a state of charge obtained after the electrochemical cell pack is fully charged; and determines the state of health of the electrochemical cell pack based on the third state of health and the fourth state of health.

In an embodiment, an average value of the third state of health and the fourth state of health is used as the state of health of the electrochemical cell pack in the battery module. In this way, battery capacities and states of charge during charging and discharging of the electrochemical cell pack can be comprehensively considered, thereby further improving accuracy of detecting a state of health of a battery.

According to a third aspect, an embodiment of this application provides a method for detecting a state of health of a battery. The method is applied to a battery system. The battery system includes a plurality of battery modules and a processing module. Each of the plurality of battery modules includes a battery management system and an electrochemical cell pack controlled by the battery management system. The method includes: The battery system controls electrochemical cell packs in the plurality of battery modules to alternately perform a discharging or charging operation, where a sum of power of electrochemical cell packs in battery modules other than a first battery module in the plurality of battery modules is greater than power required by a target power-supplied object, and the first battery module is any one of the plurality of battery modules; the battery system records a target time, where the target time is discharge duration of an electrochemical cell pack in the first battery module, or charging duration of an electrochemical cell pack in the first battery module, or discharge duration and charging duration of an electrochemical cell pack in the first battery module; and the battery system determines a state of health of the electrochemical cell pack in the first battery module based on the target time.

In this method for detecting a state of health of a battery, the processing module controls the plurality of battery modules to alternately perform the discharging or charging operation, and then determines a state of health of each battery module based on each target time. In this way, states of health of the plurality of battery modules can be sequentially detected, thereby improving accuracy of detecting a state of health of a battery. In addition, a sum of power of electrochemical cell packs in battery modules other than any one of the plurality of battery modules is greater than the power required by the target power-supplied object. Therefore, it can be ensured that in a process of detecting a state of health of the any one of the plurality of battery modules, the battery modules other than the any one of the battery modules can normally provide electric energy for the target power-supplied object, thereby avoiding a problem that sufficient electric energy cannot be provided for the target power-supplied object in a process of detecting a state of health of a battery.

In an embodiment, the battery system is a backup power supply of a first power supply; and in the plurality of battery modules, battery modules other than a battery module that is performing the discharging or charging operation are configured to supply power to the target power-supplied object when the first power supply cannot supply power to the target power-supplied object.

In this manner, in a process in which a battery module performs the discharging or charging operation, if the plurality of battery modules need to supply power to the target power-supplied object, the plurality of battery modules can provide sufficient power for the target power-supplied object because power of battery modules other than the battery module in the plurality of battery modules is not less than the power required by the target power-supplied object, thereby avoiding a problem that sufficient power cannot be provided for the target power-supplied object in a battery detection process.

In an embodiment, the controlling electrochemical cell packs in the plurality of battery modules to alternately perform a discharging or charging operation includes: The processing module alternately sends first instruction information to battery management systems in the plurality of battery modules, where the first instruction information is used to instruct to discharge or charge the battery module; and the battery management system in each battery module controls, based on the received first instruction information, the electrochemical cell pack in each battery module to perform the discharging or charging operation.

In this method, the processing module may alternately send the first instruction information to the battery management systems in the plurality of battery modules, to instruct to discharge or charge the battery modules, and switching of a to-be-detected battery module does not need to be manually controlled. Therefore, efficiency of detecting the states of health of the plurality of battery modules can be improved. In addition, the electrochemical cell packs in the battery modules alternately perform an operation of discharging and then charging, so that a battery module whose state of health is detected can serve as a backup battery with sufficient power. In a process of detecting a state of health of another battery module, the battery module whose state of health is detected and a battery module whose state of health is not detected can be used together as a backup power supply, to provide sufficient power for the target power-supplied object.

In an embodiment, in the process of performing the charging and discharging operations, a discharge current is a preset discharge current, and a charging current is a preset charging current; and the determining a state of health of the electrochemical cell pack in the first battery module based on the target time includes: determining a first state of health of the electrochemical cell pack in the first battery module based on duration in which discharging is performed based on the preset discharge current; determining a second state of health of the electrochemical cell pack in the first battery module based on duration in which charging is performed based on the preset charging current; and determining the state of health of the electrochemical cell pack in the first battery module based on the first state of health and the second state of health.

In this method, an average value of the first state of health and the second state of health is used as the state of health of the electrochemical cell pack in the first battery module. In this way, battery capacities during charging and discharging of the electrochemical cell pack can be comprehensively considered, thereby improving accuracy of detecting a state of health of a battery.

In an embodiment, in the process of performing the charging and discharging operations, a discharge current is a preset discharge current, and a charging current is a preset charging current; and the determining a state of health of the electrochemical cell pack in the first battery module based on the target time includes: determining a third state of health of the electrochemical cell pack in the first battery module based on duration in which discharging is performed based on the preset discharge current, a first state of charge, and a second state of charge, where the first state of charge is a state of charge obtained before the electrochemical cell pack is discharged, and the second state of charge is a state of charge obtained after the electrochemical cell pack is discharged to a cut-off voltage and before the electrochemical cell pack is charged; determining a fourth state of health of the electrochemical cell pack in the first battery module based on duration in which charging is performed based on the preset charging current, the second state of charge, and a third state of charge, where the third state of charge is a state of charge obtained after the electrochemical cell pack is fully charged; and determining the state of health of the electrochemical cell pack in the first battery module based on the third state of health and the fourth state of health.

In this method, an average value of the third state of health and the fourth state of health is used as the state of health of the electrochemical cell pack in the first battery module. In this way, battery capacities and states of charge during charging and discharging of the electrochemical cell pack can be comprehensively considered, thereby further improving accuracy of detecting a state of health of a battery.

In an embodiment, when determining a state of health of the electrochemical cell pack in the first battery module based on the target time, the processing module receives the target time sent by a battery management system in the first battery module; and the processing module determines the state of health of the electrochemical cell pack in the first battery module based on the target time.

According to a fourth aspect, an embodiment of this application provides another method for detecting a state of health of a battery. A battery module controls, based on first instruction information sent by a processing module, an electrochemical cell pack in the battery module to perform a discharging or charging operation, where the first instruction information is used to instruct to discharge or charge the battery module; the battery module records a target time, where the target time is discharge duration of the electrochemical cell pack in the battery module, or charging duration of the electrochemical cell pack in the battery module, or discharge duration and charging duration of the electrochemical cell pack in the battery module; and the battery module determines a state of health of the electrochemical cell pack based on the target time; or sends the target time to the processing module, so that the processing module determines a state of health of the electrochemical cell pack.

In this method, the electrochemical cell pack can be controlled, based on the first instruction information sent by the processing module, to perform the discharging or charging operation, the target time can be recorded, and the state of health of the electrochemical cell pack can be determined based on the target time; or the target time is sent to the processing module, so that the processing module can calculate the state of health of the electrochemical cell pack based on the target time. During detection of a battery system including a plurality of such battery modules, states of health of the plurality of battery modules can be sequentially detected, thereby improving accuracy of detecting a state of health of a battery.

In an embodiment, the battery module is one of a plurality of battery modules included in a battery system, and a sum of power of battery modules other than the one battery module in the plurality of battery modules is greater than power required by a target power-supplied object; and the battery modules other than the one battery module are configured to supply power to the target power-supplied object when the first power supply cannot supply power to the target power-supplied object.

In this manner, in a process of detecting a state of health of the one battery module, if the plurality of battery modules need to supply power to the target power-supplied object, the plurality of battery modules can provide sufficient power for the target power-supplied object because the sum of power of the battery modules other than the one battery module in the plurality of battery modules is not less than the power required by the target power-supplied object, thereby avoiding a problem that sufficient power cannot be provided for the target power-supplied object in a battery detection process.

In an embodiment, in the process of performing the charging and discharging operations, a discharge current is a preset discharge current, and a charging current is a preset charging current; and the determining a state of health of the electrochemical cell pack based on the target time includes: determining a first state of health of the electrochemical cell pack based on duration in which discharging is performed based on the preset discharge current; determining a second state of health of the electrochemical cell pack based on duration in which charging is performed based on the preset charging current; and determining the state of health of the electrochemical cell pack based on the first state of health and the second state of health.

In this method, an average value of the first state of health and the second state of health is used as the state of health of the electrochemical cell pack in the battery module. In this way, battery capacities during charging and discharging of the electrochemical cell pack can be comprehensively considered, thereby improving accuracy of detecting a state of health of a battery.

In an embodiment, in the process of performing the charging and discharging operations, a discharge current is a preset discharge current, and a charging current is a preset charging current; and the determining a state of health of the electrochemical cell pack based on the target time includes: determining a third state of health of the electrochemical cell pack based on duration in which discharging is performed based on the preset discharge current, a first state of charge, and a second state of charge, where the first state of charge is a state of charge obtained before the electrochemical cell pack is discharged, and the second state of charge is a state of charge obtained after the electrochemical cell pack is discharged to a cut-off voltage and before the electrochemical cell pack is charged; determining a fourth state of health of the electrochemical cell pack based on duration in which charging is performed based on the preset charging current, the second state of charge, and a third state of charge, where the third state of charge is a state of charge obtained after the electrochemical cell pack is fully charged; and determining the state of health of the electrochemical cell pack based on the third state of health and the fourth state of health.

In this method, an average value of the third state of health and the fourth state of health is used as the state of health of the electrochemical cell pack in the battery module. In this way, battery capacities and states of charge during charging and discharging of the electrochemical cell pack can be comprehensively considered, thereby further improving accuracy of detecting a state of health of a battery.

In an embodiment, in the process of performing the charging and discharging operations, the discharge current is the preset discharge current, or the charging current is the preset charging current, or the discharge current is the preset discharge current and the charging current is the preset charging current. In this manner, the electrochemical cell pack has a stable current during discharging or charging. Therefore, the state of health that is of the electrochemical cell pack in the battery module and that is calculated on this basis is more accurate.

In an embodiment, first power generated during discharging is used to supply power to the target power-supplied object, a sum of the first power and second power is equal to the power required by the target power-supplied object, and the second power is provided by the first power supply. In this manner, the process of detecting a state of health of a battery may be performed in a process in which the first power supply provides electric energy for the target power-supplied object, and it is not necessary to wait until the first power supply cannot provide electric energy for the target power-supplied object to detect the state of health of the battery module, thereby improving efficiency of detecting the state of health of the battery module.

In the embodiments of this application, the plurality of battery modules are controlled to alternately perform the discharging or charging operation, and then the state of health of each battery module is determined based on the target time. In this way, states of health of the plurality of battery modules can be sequentially detected, thereby improving accuracy of detecting a state of health of a battery. In addition, a sum of power of electrochemical cell packs in battery modules other than any one of the plurality of battery modules is greater than the power required by the target power-supplied object. Therefore, it can be ensured that in a process of detecting a state of health of the any one of the plurality of battery modules, the battery modules other than the any one of the battery modules can normally provide electric energy for the target power-supplied object, thereby avoiding a problem that sufficient electric energy cannot be provided for the target power-supplied object in a process of detecting a state of health of a battery.

BRIEF DESCRIPTION OF DRAWINGS

To describe the technical solutions in the embodiments of the present application more clearly, the following briefly describes the accompanying drawings required for describing the embodiments. Apparently, the accompanying drawings in the following description show merely some embodiments of the present application, and a person of ordinary skill in the art may still derive other drawings from these accompanying drawings without creative efforts.

DESCRIPTION OF EMBODIMENTS

The following describes technical solutions of embodiments in this application with reference to accompanying drawings.

Figure 1:
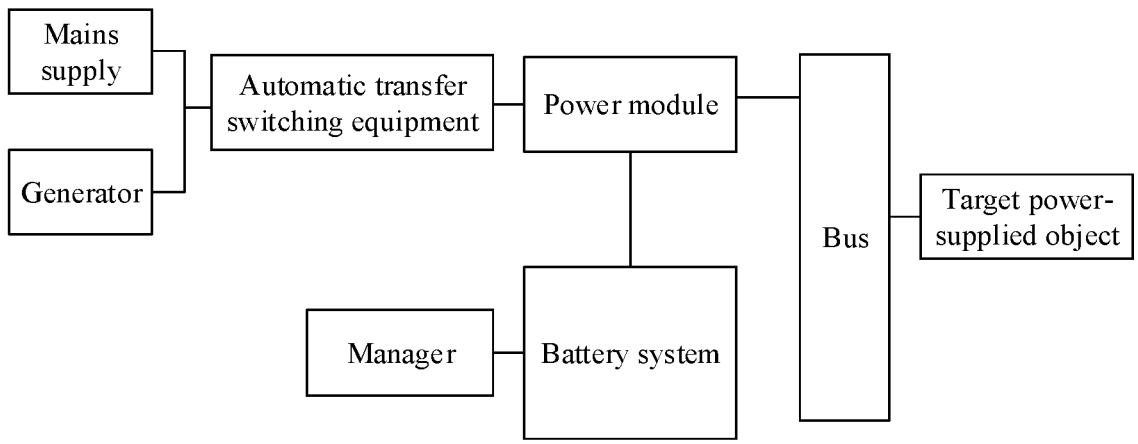
FIG. 1 is a schematic architectural diagram of a power supply system according to an embodiment of this application.

FIG. 1 is a schematic architectural diagram of a power supply system according to an embodiment of this application. The power supply system may include devices such as a mains supply, a generator, automatic transfer switching equipment (ATSE), a manager, a power module, a target power-supplied object, a bus, and a battery system. The following describes functions of the foregoing devices.

The mains supply, namely, an industrial frequency alternating current, is configured to: provide electric energy for the target power-supplied object, and provide charging electric energy for the battery system.

The generator is a mechanical device that converts another form of energy into electric energy, and is configured to: when the mains supply cannot work normally, provide electric energy for the target power-supplied object, and provide charging electric energy for the battery system.

The automatic transfer switching equipment is a switching device, is of an electromagnetic drive structure, can implement quick switching between two power supplies, and is configured to select to connect to the mains supply or the generator.

The power module is a charging power supply that can convert an alternating current into a direct current, and is configured to: supply power to the target power-supplied object, so that the target power-supplied object normally works; and charge the battery system, so that the battery system stores electric energy.

The manager is a device used by an administrator to control the battery system. For example, the manager may send, to a processing module, an instruction information for detecting states of charge of a plurality of battery modules in the battery system. It should be noted that the manager may further send an instruction with another function (for example, stopping charging the plurality of battery modules) to the processing module. This is not limited herein.

The target power-supplied object is a communications device (for example, a server) that performs a service operation, and needs the battery system to provide electric energy.

The bus is a main power line through which the battery system provides electric energy for the target power-supplied object.

The battery system is a module that stores electric energy in the power supply system. When the mains supply and the generator cannot normally provide electric energy for the target power-supplied object, the battery system may provide electric energy for the target power-supplied object.

Figure 2:
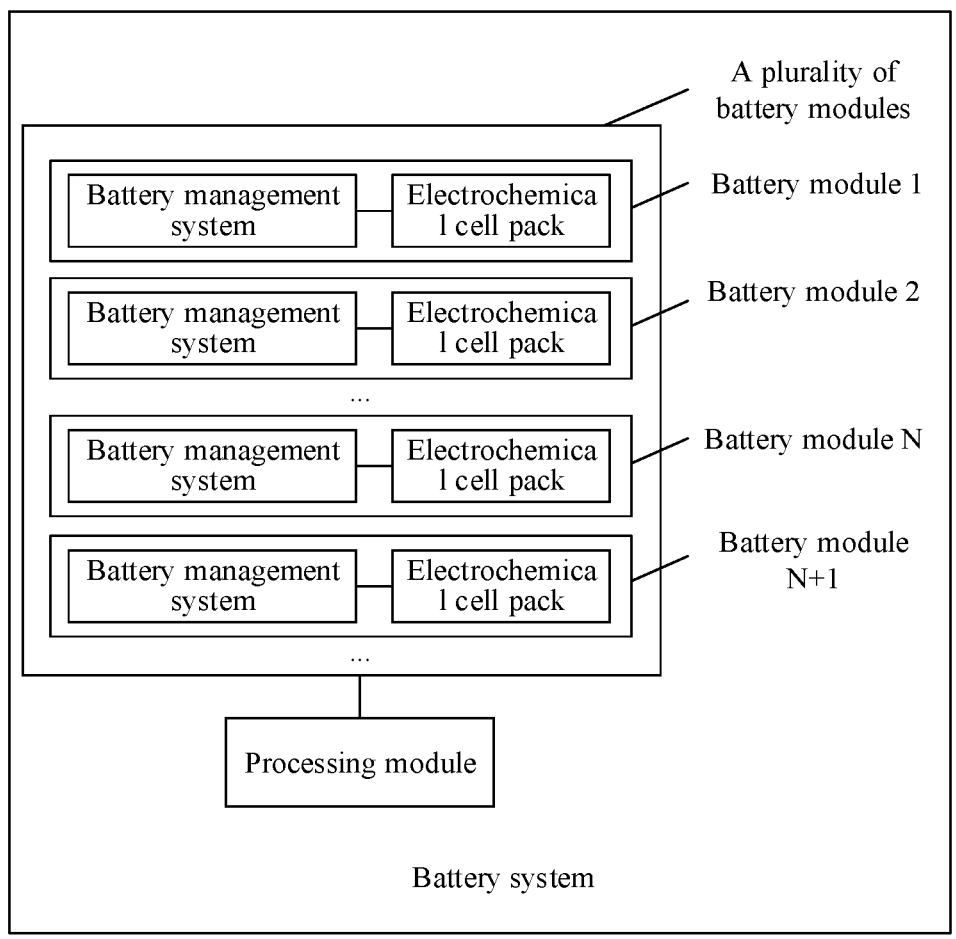
FIG. 2 is a schematic diagram of a battery system according to an embodiment of this application.

FIG. 2 is a schematic diagram of a battery system according to an embodiment of this application. The battery system includes a plurality of battery modules and a processing module. Each of the plurality of battery modules includes a battery management system (BMS) and an electrochemical cell pack controlled by the battery management system. The following describes the modules in the battery system.

The plurality of battery modules (including a battery module 1, a battery module 2, . . . , a battery module N, a battery module N+1, . . . ) are modules that store electric energy in the battery system. When a mains supply and a generator cannot normally provide electric energy for the target power-supplied object, the plurality of battery modules may provide electric energy for the target power-supplied object. Each of the plurality of battery modules includes the electrochemical cell pack and the battery management system. The electrochemical cell pack is configured to store electric energy. The battery management system is a device configured to manage the electrochemical cell pack, and can monitor a status of the electrochemical cell pack, to prevent the electrochemical cell pack from being overcharged or over discharged, and prolong a service life of the electrochemical cell pack. Main functions of the battery management system include: detecting a state of charge (SOC) of the electrochemical cell pack, monitoring a working status (parameters such as a voltage, a current, and a temperature on an end side) of the electrochemical cell pack, detecting a total voltage of the plurality of battery modules, detecting a total current of the plurality of battery modules, displaying and/or recording collected data, communicating with another connected device, and the like.

The processing module is a device configured to control the battery management system in each of the plurality of battery modules. For example, the processing module may send an instruction information to a battery management system in any one of the plurality of battery modules, to instruct the battery management system to detect a state of charge of an electrochemical cell pack in the battery module. It should be noted that the processing module may further send an instruction with another function (for example, stopping charging any one of the plurality of battery modules) to a battery management system in the any one of the battery modules. This is not limited herein. It should be noted that the processing module may be a separate module, or may be combined with a battery management system in any one of the plurality of battery modules to implement a function of the processing module. The processing module may be a hardware circuit, or may be a function module obtained by running program code by a processor.

Figure 3:
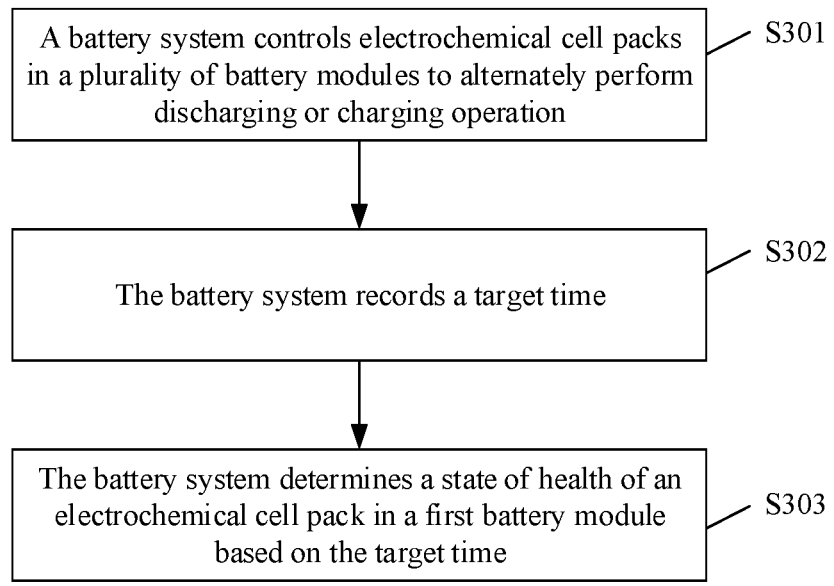
FIG. 3 is a schematic diagram of a method for detecting a state of health of a battery according to an embodiment of this application.

FIG. 3 is a flowchart of a method for detecting a state of health of a battery according to an embodiment of this application. The method may be implemented based on the battery system shown in FIG. 2. The method includes but is not limited to the following operations.

S301. The battery system controls electrochemical cell packs in the plurality of battery modules to alternately perform a discharging or charging operation.

In an embodiment, a sum of power of electrochemical cell packs in battery modules other than a first battery module in the plurality of battery modules is greater than power required by a target power-supplied object, and the first battery module is any one of the plurality of battery modules. The sum of the power of the electrochemical cell packs in the battery modules other than the first battery module in the plurality of battery modules is greater than the power required by the target power-supplied object. Therefore, it can be ensured that in a process of detecting a state of health of the first battery module, the battery modules other than the first battery module can normally provide electric energy for the target power-supplied object, thereby avoiding a problem that sufficient electric energy cannot be provided for the target power-supplied object in a process of detecting a state of health of a battery.

In an embodiment, in the plurality of battery modules, battery modules other than a battery module that is performing the discharging or charging operation are configured to supply power to the target power-supplied object when the first power supply cannot supply power to the target power-supplied object. In this manner, in a process in which a battery module performs the discharging or charging operation, if the plurality of battery modules need to supply power to the target power-supplied object, the plurality of battery modules can provide sufficient power for the target power-supplied object because power of battery modules other than the battery module in the plurality of battery modules is not less than the power required by the target power-supplied object, thereby avoiding a problem that sufficient power cannot be provided for the target power-supplied object in a battery detection process.

In an embodiment, in controlling electrochemical cell packs in the plurality of battery modules to alternately perform a discharging or charging operation, the processing module alternately sends first instruction information to battery management systems in the plurality of battery modules, where the first instruction information is used to instruct to discharge or charge the battery module; and a battery management system in each battery module controls, based on the received first instruction information, an electrochemical cell pack in each battery module to perform the discharging or charging operation.

In this method, the processing module may alternately send the first instruction information to the battery management systems in the plurality of battery modules, to instruct to discharge or charge the battery modules, and switching of a to-be-detected battery module does not need to be manually controlled. Therefore, efficiency of detecting states of health of the plurality of battery modules can be improved. In addition, the electrochemical cell packs in the battery modules alternately perform an operation of discharging and then charging, so that a battery module whose state of health is detected can serve as a backup battery with sufficient power. In a process of detecting a state of health of another battery module, the battery module whose state of health is detected and a battery module whose state of health is not detected can be used together as a backup power supply, to provide sufficient power for the target power-supplied object.

In the process of performing the charging and discharging operations, a discharge current is a preset discharge current, or a charging current is a preset charging current, or a discharge current is the preset discharge current and a charging current is the preset charging current. In this manner, the electrochemical cell pack has a stable current during discharging or charging. Therefore, a state of health that is of the electrochemical cell pack in the first battery module and that is calculated on this basis is more accurate.

The following uses the first battery module as an example to describe a method for calculating a state of health of a single battery module in the plurality of battery modules.

The battery system controls the electrochemical cell pack in the first battery module to perform the discharging or charging operation. The discharging or charging operation may include three cases. The following describes the three cases.

In a first case, in the process of performing the charging or discharging operation, the discharge current is the preset discharge current, and the charging current is not limited. That the battery management system in the first battery module controls, based on the first instruction information, the electrochemical cell pack in the first battery module to perform the discharging or charging operation includes: The battery management system in the first battery module increases a voltage of the electrochemical cell pack in the first battery module, so that the electrochemical cell pack is discharged based on the preset discharge current until the voltage of the electrochemical cell pack reaches a cut-off voltage; and then, controls the electrochemical cell pack in the first battery module to be charged until the electrochemical cell pack is fully charged.

In a second case, in the process of performing the charging and discharging operations, the discharge current is not limited, and the charging current is the preset charging current. That the battery management system in the first battery module controls, based on the first instruction information, the electrochemical cell pack in the first battery module to perform the discharging or charging operation includes: The battery management system in the first battery module controls the electrochemical cell pack in the first battery module to be discharged until a cut-off voltage is reached; and then the battery management system in the first battery module decreases a voltage of the electrochemical cell pack in the first battery module, so that the electrochemical cell pack is charged based on the preset charging current until the electrochemical cell pack is fully charged.

In a third case, in the process of performing the charging and discharging operations, the discharge current is the preset discharge current, and the charging current is the preset charging current. That the battery management system in the first battery module controls, based on the first instruction information, the electrochemical cell pack in the first battery module to perform the discharging or charging operation includes: First, the battery management system in the first battery module increases a voltage of the electrochemical cell pack in the first battery module, so that the electrochemical cell pack is discharged based on the preset discharge current until the voltage of the electrochemical cell pack reaches a cut-off voltage. Then, the battery management system in the first battery module decreases the voltage of the electrochemical cell pack in the first battery module, so that the electrochemical cell pack is charged based on the preset charging current until the electrochemical cell pack is fully charged.

In an embodiment, the battery system is a backup power supply of the first power supply, the first power generated during discharging is used to supply power to the target power-supplied object, a sum of the first power and second power is equal to the power required by the target power-supplied object, and the second power is provided by the first power supply. For example, the target power-supplied object currently needs power of 100 watts, the first power generated during discharging is 10 watts, the second power provided by the first power supply is 90 watts, and the sum of the first power and the second power is equal to the power required by the target power-supplied object. In addition, the first power and the second power may be other values. This is merely an example herein. In this manner, the process of detecting a state of health of a battery may be performed in a process in which the first power supply provides electric energy for the target power-supplied object, and it is not necessary to wait until the first power supply cannot provide electric energy for the target power-supplied object to detect the states of health of the plurality of battery modules, thereby improving efficiency of detecting the state of health of the battery module.

S302. The battery system records a target time.

The target time is discharge duration of the electrochemical cell pack in the first battery module, or charging duration of the electrochemical cell pack in the first battery module, or discharge duration and charging duration of the electrochemical cell pack in the first battery module.

For the foregoing three cases of the discharging or charging operation, there are at least three manners of recording the target time. The following describes the three manners.

In a first manner of recording the target time, for the foregoing first case, the battery management system in the first battery module records duration in which discharging is performed in the first battery module based on the preset discharge current.

In a second manner of recording the target time, for the foregoing second case, the battery management system in the first battery module records duration in which charging is performed in the first battery module based on the preset charging current.

In a third manner of recording the target time, for the foregoing third case, the battery management system in the first battery module records duration in which discharging is performed in the first battery module based on the preset discharge current and duration in which charging is performed in the first battery module based on the preset charging current.

S303. The battery system determines the state of health of the electrochemical cell pack in the first battery module based on the target time.

In an embodiment, the processing module may determine the state of health of the electrochemical cell pack in the first battery module based on the target time. The processing module receives the target time sent by the battery management system in the first battery module; and the processing module determines the state of health of the electrochemical cell pack in the first battery module based on the target time.

In an embodiment, the battery management system in the first battery module may determine the state of health of the electrochemical cell pack in the first battery module based on the target time.

In the foregoing three manners of recording the target time, there is a difference in determining the state of health of the electrochemical cell pack in the first battery module. For ease of understanding, the following separately describes how to determine the state of health of the electrochemical cell pack in the first battery module in the three manners.

In the first manner of recording the target time, the determining the state of health of the electrochemical cell pack in the first battery module based on the target time includes: determining the state of health of the electrochemical cell pack in the first battery module based on the duration in which discharging is performed based on the preset discharge current and the preset discharge current. For example, the duration in which the electrochemical cell pack in the first battery module is discharged based on the preset discharge current is $t_1$, the preset discharge current is $I_1$, and a rated capacity of the electrochemical cell pack is $Q_0$. In this case, the state of health SOH of the electrochemical cell pack may be calculated by using a formula 1-1. The formula 1-1 is as follows:

$$SOH = \frac{t_1 * I_1}{Q_0}.\qquad 1\text{-}1$$

In this manner, the battery management system in the first battery module may control the electrochemical cell pack in the first battery module to be discharged based on the preset discharge current, and then determine the state of health of the electrochemical cell pack in the first battery module based on the discharge duration. The discharge current of the electrochemical cell pack in the discharging process is stabilized at the preset discharge current, and therefore the state of health that is of the electrochemical cell pack in the first battery module and that is calculated on this basis is more accurate, thereby improving accuracy of detecting a state of health of a battery. In addition, in the battery system, the battery does not need to be manually controlled to be charged or discharged, thereby improving efficiency of detecting the state of health of the battery.

In addition, the determining the state of health of the electrochemical cell pack in the first battery module based on the target time may further include: determining the state of health of the electrochemical cell pack in the first battery module based on the duration in which discharging is performed based on the preset discharge current, the preset discharge current, a first state of charge, and a second state of charge. The first state of charge is a state of charge obtained before the electrochemical cell pack is discharged, and the second state of charge is a state of charge obtained after the electrochemical cell pack is discharged to the cut-off voltage and before the electrochemical cell pack is charged.

For example, the duration in which the electrochemical cell pack in the first battery module is discharged based on the preset discharge current is $t_2$, the preset discharge current is $I_2$, the first state of charge is 95%, and the second state of charge is 5%. It may be learned from a correspondence between a state of charge and a battery capacity that a battery capacity is decreased by $Q_1$ from a state of charge of 95% to a state of charge of 5%. The battery management system prestores the correspondence between a state of charge and a battery capacity. In this case, the state of health SOH of the electrochemical cell pack may be calculated by using a formula 1-2. The formula 1-2 is as follows:

$$SOH = \frac{t_2 * I_2}{Q_1}.\qquad 1\text{-}2$$

In this manner, on the basis of the foregoing manner, detection of the state of charge of the electrochemical cell pack in the first battery module is added. In this way, a more accurate theoretical battery capacity variable can be obtained, thereby improving accuracy of a state of health of a battery.

The following describes obtaining of the first state of charge and the second state of charge. Before the battery management system in the first battery module increases the voltage of the electrochemical cell pack in the first battery module, the state of charge of the electrochemical cell pack may be first determined, and the state of charge may be referred to as the first state of charge. After the voltage of the electrochemical cell pack reaches the cut-off voltage, the state of charge of the electrochemical cell pack is determined again, and the state of charge may be referred to as the second state of charge. In addition, the battery management system may determine the state of charge of the electrochemical cell pack based on a detected open-circuit voltage of the electrochemical cell pack and a correspondence between the open-circuit voltage and the state of charge of the electrochemical cell pack. The battery management system prestores the correspondence between the open-circuit voltage and the state of charge of the electrochemical cell pack.

In the second manner of recording the target time, the determining the state of health of the electrochemical cell pack in the first battery module based on the target time includes: determining the state of health of the electrochemical cell pack in the first battery module based on the duration in which charging is performed based on the preset charging current and the preset charging current. For example, the duration in which the electrochemical cell pack in the first battery module is charged based on the preset charging current is $t_3$, the preset charging current is $I_3$, and a rated capacity of the electrochemical cell pack is $Q_0$. In this case, the state of health SOH of the electrochemical cell pack may be calculated by using a formula 1-1 The formula 1-3 is as follows:

$$SOH = \frac{t_3 * I_3}{Q_0}.\qquad 1\text{-}3$$

In this manner, the battery management system in the first battery module may control the electrochemical cell pack in the first battery module to be charged based on the preset charging current, and then determine the state of health of the electrochemical cell pack in the first battery module based on the charging duration. The charging current in the entire charging process is stabilized at the preset charging current, and therefore the state of health that is of the electrochemical cell pack in the first battery module and that is calculated on this basis is more accurate, thereby improving accuracy of detecting a state of health of a battery. In addition, in the battery system, the battery does not need to be manually controlled to be charged or discharged, thereby improving efficiency of detecting the state of health of the battery.

In addition, the determining the state of health of the electrochemical cell pack in the first battery module based on the target time may further include: determining the state of health of the electrochemical cell pack in the first battery module based on the duration in which charging is performed based on the preset charging current, the preset charging current, a second state of charge, and a third state of charge. The second state of charge is a state of charge obtained after the electrochemical cell pack is discharged to the cut-off voltage and before the electrochemical cell pack is charged; and the third state of charge is a state of charge obtained after the electrochemical cell pack is fully charged.

For example, the duration in which the electrochemical cell pack in the first battery module is charged based on the preset charging current is $t_4$, the preset charging current is $I_4$, the second state of charge is 5%, and the third state of charge is 90%. It may be learned from a correspondence between a state of charge and a battery capacity that a battery capacity is increased by $Q_2$ from a state of charge of 5% to a state of charge of 90%. The battery management system prestores the correspondence between a state of charge and a battery capacity. In this case, the state of health SOH of the electrochemical cell pack may be calculated by using a formula 1-4. The formula 1-4 is as follows:

$$SOH = \frac{t_4 * I_4}{Q_2}. \qquad 1\text{-}4$$

In this manner, on the basis of the foregoing manner, detection of the state of charge of the electrochemical cell pack in the first battery module is added. In this way, a more accurate theoretical battery capacity variable can be obtained, thereby improving accuracy of a state of health of a battery.

The following describes obtaining of the third state of charge. After the electrochemical cell pack in the first battery module is fully charged, the state of charge of the electrochemical cell pack may be determined, and the state of charge is the third state of charge. In addition, the battery management system may determine the state of charge of the electrochemical cell pack based on a detected open-circuit voltage of the electrochemical cell pack and a correspondence between the open-circuit voltage and the state of charge of the electrochemical cell pack. The battery management system prestores the correspondence between the open-circuit voltage and the state of charge of the electrochemical cell pack.

In the third manner of recording the target time, the determining the state of health of the electrochemical cell pack in the first battery module based on the target time includes: determining a first state of health of the electrochemical cell pack in the first battery module based on the duration in which discharging is performed based on the preset discharge current; determining a second state of health of the electrochemical cell pack in the first battery module based on the duration in which charging is performed based on the preset charging current; and determining the state of health of the electrochemical cell pack in the first battery module based on the first state of health and the second state of health.

For example, the duration in which the electrochemical cell pack in the first battery module is discharged based on the preset discharge current is $t_5$, the preset discharge current is $I_5$, the duration in which the electrochemical cell pack in the first battery module is charged based on the preset charging current is $t_6$, the preset charging current is $I_6$, and a rated capacity of the electrochemical cell pack is $Q_0$. In this case, the state of health SOH of the electrochemical cell pack may be calculated by using formulas 1-5, 1-6, and 1-7. The formulas 1-5, 1-6, and 1-7 are as follows:

$$SOH_1 = \frac{t_5 * I_5}{Q_0}; \qquad 1\text{-}5$$

$$SOH_2 = \frac{t_6 * I_6}{Q_0}; \text{ and} \qquad 1\text{-}6$$

$$SOH = SOH_1 * a + SOH_2 * b, \qquad 1\text{-}7$$

where $SOH_1$ represents the first state of health of the electrochemical cell pack in the first battery module, $SOH_2$ represents the second state of health of the electrochemical cell pack in the first battery module, a represents a calculation proportion of the first state of health, and b represents a calculation proportion of the second state of health. It should be noted that a sum of a and b is 1, and a and b may be a plurality of values based on an actual situation. For example, a is 0.5, and b is 0.5; or a is 0.7, and b is 0.3. In this way, battery capacities during charging and discharging of the electrochemical cell pack can be comprehensively considered, thereby improving accuracy of detecting a state of health of a battery.

In addition, the determining the state of health of the electrochemical cell pack in the first battery module based on the target time includes: determining a third state of health of the electrochemical cell pack in the first battery module based on the duration in which discharging is performed based on the preset discharge current, the preset discharge current, a first state of charge, and a second state of charge; determining a fourth state of health of the electrochemical cell pack in the first battery module based on the duration in which charging is performed based on the preset charging current, the preset charging current, the second state of charge, and a third state of charge; and determining that the state of health of the electrochemical cell pack in the first battery module is an average value of the third state of health and the fourth state of health. The first state of charge is a state of charge obtained before the electrochemical cell pack is discharged, the second state of charge is a state of charge obtained after the electrochemical cell pack is discharged to the cut-off voltage and before the electrochemical cell pack is charged, and the third state of charge is a state of charge obtained after the electrochemical cell pack is fully charged.

For example, the duration in which the electrochemical cell pack in the first battery module is discharged based on the preset discharge current is $t_7$, the preset discharge current is $I_7$, the duration in which the electrochemical cell pack in the first battery module is charged based on the preset charging current is $t_8$, the preset charged current is $I_8$, the first state of charge is 90%, the second state of charge is 10%, and the third state of charge is 95%. It may be learned from a correspondence between a state of charge and a battery capacity that a battery capacity is decreased by $Q_3$ from a state of charge of 90% to a state of charge of 10%, and the battery capacity is increased by $Q_4$ from the state of charge of 10% to a state of charge of 95%. In this case, the state of health SOH of the electrochemical cell pack may be calculated by using formulas 1-8, 1-9, and 1-10. The formulas 1-8, 1-9, and 1-10 are as follows:

$$SOH_3 = \frac{t_7 * I_7}{Q_3}; \qquad 1\text{-}8$$

$$SOH_4 = \frac{t_8 * I_8}{Q_4}; \text{ and} \qquad 1\text{-}9$$

$$SOH = SOH_3 * c + SOH_4 * d, \qquad 1\text{-}10$$

where $SOH_3$ represents the third state of health of the electrochemical cell pack in the first battery module, $SOH_4$ represents the fourth state of health of the electrochemical cell pack in the first battery module, c represents a calculation proportion of the third state of health, and d represents a calculation proportion of the fourth state of health. It should be noted that a sum of c and d is 1, and c and d may be a plurality of values based on an actual situation. For example, c is 0.5, and d is 0.5; or c is 0.7, and d is 0.3. In this manner, on the basis of the foregoing manner, detection of the state of charge of the electrochemical cell pack in the first battery module is added. In this way, a more accurate theoretical battery capacity variable can be obtained, thereby improving accuracy of a state of health of a battery.

In an embodiment, after determining the state of health of the electrochemical cell pack in the first battery module based on the target time, the processing module controls, in sequence, a next battery module to perform the discharging or charging operation. Then, a battery management system in the next battery module records a target time corresponding to the next battery module. The target time corresponding to the next battery module is discharge duration of an electrochemical cell pack in the next battery module, or charging duration of an electrochemical cell pack in the next battery module, or discharge duration and charging duration of an electrochemical cell pack in the next battery module. The battery management system in the next battery module or the processing module determines a state of health of the next battery module based on the target time corresponding to the next battery module.

It should be noted that each of a manner of controlling, by the battery management system in the next battery module based on the first instruction information, the electrochemical cell pack in the next battery module to be discharged and/or charged, a manner of recording, by the battery management system in the next battery module, the target time corresponding to the next battery module, and a manner of determining, by the battery management system in the next battery module or the processing module, the state of health of the next battery module based on the target time corresponding to the next battery module may be the foregoing manner used in the first battery module. In this method, the battery system can sequentially detect the states of health of the plurality of battery modules, and switching of a to-be-detected battery module does not need to be manually controlled. Therefore, efficiency of detecting the states of health of the plurality of battery modules is improved.

The following describes some possible solutions extended based on the method embodiment shown in FIG. 3.

In an embodiment, before the electrochemical cell packs in the plurality of battery modules are controlled to alternately perform the discharging or charging operation, the method may further include: determining that the plurality of battery modules meet a detection start condition.

The detection start condition may be that the processing module receives an instruction that is sent by a manager and that is for starting to detect a state of health of a battery, or may be that a state of health of at least one of the plurality of battery modules is not updated within a first preset time. It should be noted that there may be another detection start condition. This is not limited herein.

In an embodiment, before the electrochemical cell packs in the plurality of battery modules are controlled to alternately perform the discharging or charging operation, and after the processing module determines that the plurality of battery modules meet the detection start condition, the method may further include: The processing module forbids charging the plurality of battery modules. After the processing module forbids charging the plurality of battery modules, the plurality of battery modules are in a standby state within the first preset time. It should be noted that the standby state is a status in which the plurality of battery modules perform no substantive work (charging or discharging). However, if the plurality of battery modules need to provide electric energy for the target power-supplied object, in this case, the plurality of battery modules may provide electric energy for the target power-supplied object. In this manner, open-circuit voltages of the plurality of battery modules can be stable, thereby avoiding a problem that an inaccurate state of health is detected due to an unstable open-circuit voltage.

In an embodiment, after the processing module forbids a power module to charge the plurality of battery modules, the processing module adds a charging forbidden flag and/or a flag of detecting a state of health to the plurality of battery modules. In this manner, another device or an administrator can be prevented from performing an unnecessary operation on the plurality of battery modules, and impact of the another device or the administrator on detection results of the states of health of the plurality of battery modules can be avoided.

In an embodiment, before the electrochemical cell packs in the plurality of battery modules are controlled to alternately perform the discharging or charging operation, the method may further include: The processing module sorts the plurality of battery modules. Optionally, a sorting manner may be that sorting is performed based on at least one of a state of health detected last time, a use time, and a time since last detection of a state of health of each of the plurality of battery modules. For example, the plurality of battery modules may be sorted in ascending order of states of health that are of the plurality of battery modules and that are detected last time. In this way, a battery module with an undesirable state of health can be more conveniently and more quickly found.

In an embodiment, in a process of detecting a state of health of a battery, the processing module determines that the plurality of battery modules meet a detection end condition. The detection end condition includes at least one of the following: Calculation of the state of health of each of the plurality of battery modules is completed, any one of the plurality of battery modules is abnormal, a detection time of any one of the plurality of battery modules is greater than a second preset time, and duration in which a current of any one of the plurality of battery modules falls outside a preset range is greater than a third preset time. It should be noted that there may be another detection end condition. This is not limited herein.

In an embodiment, after the processing module determines that the plurality of battery modules meet the detection end condition, the processing module may further send a detection result and an end reason to the manager. In this manner, the administrator can know the detection result and the end reason. If the end reason is an abnormality, the administrator can conveniently perform maintenance for the abnormality.

In an embodiment, after the processing module determines that the plurality of battery modules meet the detection end condition, the processing module may further clear the plurality of charging forbidden flags and/or the plurality of flags of detecting a state of health. In this manner, after detection ends, the another device or the administrator may perform an operation on the plurality of battery modules.

In the method shown in FIG. 2, the plurality of battery modules are controlled to alternately perform the discharging or charging operation, and then the state of health of each battery module is determined based on the target time. In this way, the states of health of the plurality of battery modules can be sequentially detected, thereby improving accuracy of detecting a state of health of a battery. In addition, a sum of power of electrochemical cell packs in battery modules other than any one of the plurality of battery modules is greater than the power required by the target power-supplied object. Therefore, it can be ensured that in a process of detecting a state of health of the any one of the plurality of battery modules, the battery modules other than the any one of the battery modules can normally provide electric energy for the target power-supplied object, thereby avoiding a problem that sufficient electric energy cannot be provided for the target power-supplied object in a process of detecting a state of health of a battery.

Figure 4:
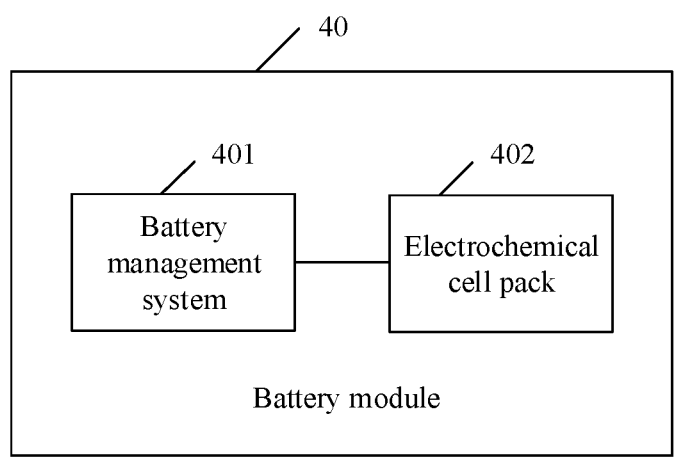
FIG. 4 is a schematic diagram of a battery module according to an embodiment of this application.

FIG. 4 is a schematic diagram of a battery module according to an embodiment of this application. The battery module 40 includes a battery management system 401 and an electrochemical cell pack 402 controlled by the battery management system. The electrochemical cell pack 402 is configured to store electric energy. The battery management system 401 is a device configured to manage the electrochemical cell pack, and can monitor a status of the electrochemical cell pack, to prevent the electrochemical cell pack from being overcharged or over discharged, and prolong a service life of the electrochemical cell pack. Main functions of the battery management system include: detecting a state of charge of the electrochemical cell pack, monitoring a working status (parameters such as a voltage, a current, and a temperature on an end side) of the electrochemical cell pack, detecting a total voltage of a plurality of battery modules, detecting a total current of the plurality of battery modules, displaying and/or recording collected data, communicating with another connected device, and the like.

Figure 5:
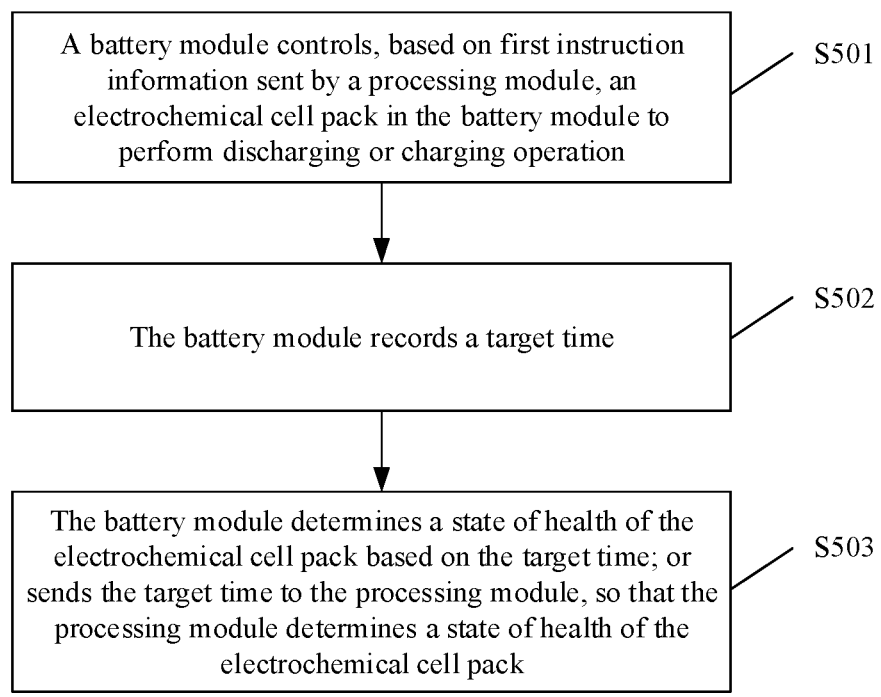
FIG. 5 is a schematic diagram of another method for detecting a state of health of a battery according to an embodiment of this application.

FIG. 5 is a flowchart of another method for detecting a state of health of a battery according to an embodiment of this application. The method may be implemented based on the battery system shown in FIG. 4. The method includes but is not limited to the following operations.

S501. A battery module controls, based on first instruction information sent by a processing module, an electrochemical cell pack in the battery module to perform a discharging or charging operation.

The first instruction information is used to instruct to discharge or charge the battery module. In an embodiment, that a battery module controls, based on first instruction information sent by a processing module, an electrochemical cell pack in the battery module to perform a discharging or charging operation includes: A battery management system in the battery module controls, based on the first instruction information sent by the processing module, the electrochemical cell pack in the battery module to perform the discharging or charging operation. The discharging or charging operation may include three cases. For the three cases, reference may be made to the three cases that may be included in the discharging or charging operation and that are described in operation S301 in FIG. 3. Details are not described herein again.

S502. The battery module records a target time.

The target time is discharge duration of the electrochemical cell pack in the battery module, or charging duration of the electrochemical cell pack in the battery module, or discharge duration and charging duration of the electrochemical cell pack in the battery module. In an embodiment, that the battery module records a target time includes: The battery management system in the battery module records the target time. For a manner of recording the target time, reference may be made to the manner that is of recording the target time and that is described in operation S302 in FIG. 3.

S503. The battery module determines a state of health of the electrochemical cell pack based on the target time; or sends the target time to the processing module, so that the processing module determines a state of health of the electrochemical cell pack.

In an embodiment, in determining a state of health of the electrochemical cell pack based on the target time, the battery management system in the battery module determines the state of health of the electrochemical cell pack based on the target time. For a manner of determining the state of health of the electrochemical cell pack based on the target time, reference may be made to the manner that is of determining the state of health of the electrochemical cell pack in the first battery module based on the target time and that is described in operation S303 in FIG. 3. Details are not described herein again.

In this method, the electrochemical cell pack can be controlled, based on the first instruction information sent by the processing module, to perform the discharging or charging operation, the target time can be recorded, and the state of health of the electrochemical cell pack can be determined based on the target time; or the target time is sent to the processing module, so that the processing module can calculate the state of health of the electrochemical cell pack based on the target time. During detection of a battery system including a plurality of such battery modules, states of health of the plurality of battery modules can be sequentially detected, thereby improving accuracy of detecting a state of health of a battery.

In an embodiment, the battery module is one of a plurality of battery modules included in a battery system, and a sum of power of battery modules other than the one battery module in the plurality of battery modules is greater than power required by a target power-supplied object; and the battery modules other than the one battery module are configured to supply power to the target power-supplied object when the first power supply cannot supply power to the target power-supplied object.

In this manner, in a process of detecting a state of health of the one battery module, if the plurality of battery modules need to supply power to the target power-supplied object, the plurality of battery modules can provide sufficient power for the target power-supplied object because the power of the battery modules other than the one battery module in the plurality of battery modules is not less than the a sum of power required by the target power-supplied object, thereby avoiding a problem that sufficient power cannot be provided for the target power-supplied object in a battery detection process.

In an embodiment, in the process of performing the charging and discharging operations, a discharge current is a preset discharge current, and a charging current is a preset charging current; and the determining a state of health of the electrochemical cell pack based on the target time includes: determining a first state of health of the electrochemical cell pack based on duration in which discharging is performed based on the preset discharge current; determining a second state of health of the electrochemical cell pack based on duration in which charging is performed based on the preset charging current; and determining the state of health of the electrochemical cell pack based on the first state of health and the second state of health.

In this method, an average value of the first state of health and the second state of health is used as the state of health of the electrochemical cell pack in the battery module. In this way, battery capacities during charging and discharging of the electrochemical cell pack can be comprehensively considered, thereby improving accuracy of detecting a state of health of a battery.

In an embodiment, in the process of performing the charging and discharging operations, a discharge current is a preset discharge current, and a charging current is a preset charging current; and the determining a state of health of the electrochemical cell pack based on the target time includes: determining a third state of health of the electrochemical cell pack based on duration in which discharging is performed based on the preset discharge current, a first state of charge, and a second state of charge, where the first state of charge is a state of charge obtained before the electrochemical cell pack is discharged, and the second state of charge is a state of charge obtained after the electrochemical cell pack is discharged to a cut-off voltage and before the electrochemical cell pack is charged; determining a fourth state of health of the electrochemical cell pack based on duration in which charging is performed based on the preset charging current, the second state of charge, and a third state of charge, where the third state of charge is a state of charge obtained after the electrochemical cell pack is fully charged; and determining the state of health of the electrochemical cell pack based on the third state of health and the fourth state of health.

In this method, an average value of the third state of health and the fourth state of health is used as the state of health of the electrochemical cell pack in the battery module. In this way, battery capacities and states of charge during charging and discharging of the electrochemical cell pack can be comprehensively considered, thereby further improving accuracy of detecting a state of health of a battery.

In an embodiment, in the process of performing the charging and discharging operations, the discharge current is the preset discharge current, or the charging current is the preset charging current, or the discharge current is the preset discharge current and the charging current is the preset charging current. In this manner, the electrochemical cell pack has a stable current during discharging or charging. Therefore, the state of health that is of the electrochemical cell pack in the battery module and that is calculated on this basis is more accurate.

In an embodiment, the first power generated during discharging is used to supply power to the target power-supplied object, a sum of the first power and second power is equal to the power required by the target power-supplied object, and the second power is provided by the first power supply. In this manner, the process of detecting a state of health of a battery may be performed in a process in which the first power supply provides electric energy for the target power-supplied object, and it is not necessary to wait until the first power supply cannot provide electric energy for the target power-supplied object to detect the state of health of the battery module, thereby improving efficiency of detecting the state of health of the battery module.

In the method shown in FIG. 5, the electrochemical cell pack can be controlled, based on the first instruction information sent by the processing module, to perform the discharging or charging operation, the target time can be recorded, and the state of health of the electrochemical cell pack can be determined based on the target time; or the target time is sent to the processing module, so that the processing module can calculate the state of health of the electrochemical cell pack based on the target time. In this method, during detection of a battery system including a plurality of such battery modules, states of health of the plurality of battery modules can be sequentially detected, thereby improving accuracy of detecting a state of health of a battery.

The foregoing descriptions are merely specific embodiments of this application, but are not intended to limit the protection scope of this application. Any modification or replacement readily figured out by a person skilled in the art within the technical scope disclosed in this application shall fall within the protection scope of this application. Therefore, the protection scope of this application shall be subject to the protection scope of the claims.

What is claimed is:

1. A battery system, comprising:
   a plurality of battery modules, including a first battery module, wherein each of the battery modules comprises a battery management system and an electrochemical cell pack; and
   a processing module configured to control the electrochemical cell pack of each of the battery modules to alternately perform a discharging or charging operation, wherein a sum of power of the electrochemical cell packs in battery modules other than the first battery module is greater than power required by a target power-supplied object,
   wherein a battery management system in the first battery module is configured to record a target time representing discharge duration, charging duration, or discharge duration and charging duration of the electrochemical cell pack in the first battery module, and
   wherein the processing module or the battery management system in the first battery module is configured to determine a state of health of the electrochemical cell pack in the first battery module based on the target time.

2. The battery system according to claim 1, wherein the battery system is a backup power supply of a first power supply, and wherein in the plurality of battery modules, battery modules other than a battery module that is performing the discharging or charging operation are configured to supply power to the target power-supplied object when the first power supply cannot supply power to the target power-supplied object.

3. The battery system according to claim 1, wherein when alternately performing a discharging or charging operation:
   the processing module is configured to alternately send first instruction information to battery management systems of the battery modules to instruct to discharge or charge the battery modules; and
   the battery management system in each battery module is configured to control, based on the first instruction information, the corresponding electrochemical cell pack to perform the discharging or charging operation.

4. The battery system according to claim 1, wherein in a process of performing a charging or discharging operation, a discharge current is a preset discharge current, or a charging current is a preset charging current.

5. The battery system according to claim 1, wherein in a process of performing charging and discharging operations, a discharge current is a preset discharge current and a charging current is a preset charging current, and wherein determining a state of health of the electrochemical cell pack in the first battery module based on the target time comprises:
   determining a first state of health of the electrochemical cell pack in the first battery module based on duration in which discharging is performed based on the preset discharge current;
   determining a second state of health of the electrochemical cell pack in the first battery module based on duration in which charging is performed based on the preset charging current; and determining the state of health of the electrochemical cell pack in the first battery module based on the first state of health and the second state of health.

6. The battery system according to claim 1, wherein in a process of performing the charging and discharging operations, a discharge current is a preset discharge current and a charging current is a preset charging current, and wherein determining a state of health of the electrochemical cell pack in the first battery module based on the target time comprises:
  determining a third state of health of the electrochemical cell pack in the first battery module based on duration in which discharging is performed based on the preset discharge current, a first state of charge, and a second state of charge, wherein the first state of charge is obtained before the electrochemical cell pack is discharged, and the second state of charge is obtained after the electrochemical cell pack is discharged to a cut-off voltage and before the electrochemical cell pack is charged;
  determining a fourth state of health of the electrochemical cell pack in the first battery module based on duration in which charging is performed based on the preset charging current, the second state of charge, and a third state of charge that is obtained after the electrochemical cell pack is fully charged; and
  determining the state of health of the electrochemical cell pack in the first battery module based on the third state of health and the fourth state of health.

7. The battery system according to claim 1, wherein determining a state of health of the electrochemical cell pack in the first battery module based on the target time comprises:
  receiving the target time from the battery management system in the first battery module; and
  determining the state of health of the electrochemical cell pack in the first battery module based on the target time.

8. The battery system according to claim 1, wherein first power generated during the discharging is used to supply power to the target power-supplied object, a sum of the first power and second power is equal to the power required by the target power-supplied object, and the second power is provided by the first power supply.

9. A battery module operating as one of a plurality of battery modules of a battery system, comprising:
  an electrochemical cell pack; and
  a battery management system configured to
    control, based on first instruction information received from a processing module of the battery system, the electrochemical cell pack to perform a discharging or charging operation, wherein the first instruction information is used to instruct to discharge or charge the battery module,
    record a target time representing discharge duration, charging duration, or discharge duration and charging duration of the electrochemical cell pack of the battery module, and
    determine a state of health of the electrochemical cell pack based on the target time, or send the target time to the processing module of the battery system, so that the processing module determines a state of health of the electrochemical cell pack.

10. The battery module according to claim 9, wherein a sum of power of other battery modules in the battery system is greater than power required by a target power-supplied object, wherein the other battery modules are configured to supply power to the target power-supplied object when a first power supply cannot supply power to the target power-supplied object, and wherein the battery system is a backup power supply to the first power supply.

11. The battery module according to claim 9, wherein in a process of performing a charging or discharging operation, a discharge current is a preset discharge current, or a charging current is a preset charging current.

12. The battery module according to claim 9, wherein in a process of performing charging and discharging operations, a discharge current is a preset discharge current and a charging current is a preset charging current, and wherein determining a state of health of the electrochemical cell pack based on the target time comprises:
  determining a first state of health of the electrochemical cell pack based on duration in which discharging is performed based on the preset discharge current;
  determining a second state of health of the electrochemical cell pack based on duration in which charging is performed based on the preset charging current; and
  determining the state of health of the electrochemical cell pack based on the first state of health and the second state of health.

13. The battery module according to claim 9, wherein in a process of performing the charging and discharging operations, a discharge current is a preset discharge current and a charging current is a preset charging current, wherein determining a state of health of the electrochemical cell pack based on the target time comprises:
  determining a third state of health of the electrochemical cell pack based on duration in which discharging is performed based on the preset discharge current, a first state of charge, and a second state of charge, wherein the first state of charge is obtained before the electrochemical cell pack is discharged, and the second state of charge is obtained after the electrochemical cell pack is discharged to a cut-off voltage and before the electrochemical cell pack is charged;
  determining a fourth state of health of the electrochemical cell pack based on duration in which charging is performed based on the preset charging current, the second state of charge, and a third state of charge that is obtained after the electrochemical cell pack is fully charged; and
  determining the state of health of the electrochemical cell pack based on the third state of health and the fourth state of health.

14. The battery module according to claim 9, wherein first power generated during the discharging is used to supply power to a target power-supplied object, a sum of the first power and second power is equal to the power required by the target power-supplied object, and the second power is provided by the first power supply.

15. A method for detecting a state of health of a battery, wherein the method is applied to a battery system, the battery system comprises a plurality of battery modules and a processing module, each of the plurality of battery modules comprises a battery management system and an electrochemical cell pack controlled by the battery management system, and the method comprises:
  controlling, by a battery system, an electrochemical cell pack in each of a plurality of battery modules of the battery system to alternately perform a discharging or charging operation, wherein a sum of power of electrochemical cell packs in battery modules other than a first battery module in the plurality of battery modules is greater than power required by a target power-supplied object, wherein each battery module comprises a battery management system to control a corresponding electrochemical cell pack;

recording, by the battery system, a target time representing discharge duration, charging duration, or discharge duration and charging duration of the electrochemical cell pack in the first battery module; and determining, by the battery system, a state of health of the electrochemical cell pack in the first battery module based on the target time.

16. The method according to claim 15, wherein the battery system is a backup power supply of a first power supply; and in the plurality of battery modules, battery modules other than a battery module performing the discharging or charging operation are configured to supply power to the target power-supplied object when the first power supply cannot supply power to the target power-supplied object.

17. The method according to claim 15, wherein controlling electrochemical cell packs in the plurality of battery modules to alternately perform a discharging or charging operation comprises:

alternately sending, by a processing module of the battery system, first instruction information to battery management systems of the battery modules to instruct to discharge or charge the battery module; and controlling, by the battery management system in each battery module based on the received first instruction information, the electrochemical cell pack in each battery module to perform the discharging or charging operation.

18. The method according to claim 15, wherein in a process of performing a charging or discharging operation, a discharge current is a preset discharge current, or a charging current is a preset charging current.

19. The method according to claim 15, wherein in a process of performing charging and discharging operations, a discharge current is a preset discharge current and a charging current is a preset charging current, and wherein determining a state of health of the electrochemical cell pack in the first battery module based on the target time comprises:

determining a first state of health of the electrochemical cell pack in the first battery module based on duration in which discharging is performed based on the preset discharge current;

determining a second state of health of the electrochemical cell pack in the first battery module based on duration in which charging is performed based on the preset charging current; and determining the state of health of the electrochemical cell pack in the first battery module based on the first state of health and the second state of health.

20. The method according to claim 15, wherein in a process of performing charging and discharging operations, a discharge current is a preset discharge current and a charging current is a preset charging current, wherein determining a state of health of the electrochemical cell pack in the first battery module based on the target time comprises:

determining a third state of health of the electrochemical cell pack in the first battery module based on duration in which discharging is performed based on the preset discharge current, a first state of charge, and a second state of charge, wherein the first state of charge is a state of charge obtained before the electrochemical cell pack is discharged, and the second state of charge is a state of charge obtained after the electrochemical cell pack is discharged to a cut-off voltage and before the electrochemical cell pack is charged;

determining a fourth state of health of the electrochemical cell pack in the first battery module based on duration in which charging is performed based on the preset charging current, the second state of charge, and a third state of charge that is obtained after the electrochemical cell pack is fully charged; and determining the state of health of the electrochemical cell pack in the first battery module based on the third state of health and the fourth state of health.

* * * * *